(12) United States Patent
Lv

(10) Patent No.: US 7,545,137 B1
(45) Date of Patent: Jun. 9, 2009

(54) CURRENT DETECTING CIRCUIT

(75) Inventor: Teng Lv, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/203,430

(22) Filed: Sep. 3, 2008

(30) Foreign Application Priority Data

Jun. 25, 2008 (CN) .................. 200810302314.1

(51) Int. Cl.
*G01R 1/20* (2006.01)
(52) U.S. Cl. ........................................ 324/126
(58) Field of Classification Search .............. None
See application file for complete search history.

(56) References Cited

U.S. PATENT DOCUMENTS 5,325,062 A * 6/1994 Bachand et al. ............. 324/537
6,498,494 B2 * 12/2002 Belau et al. ................. 324/522

* cited by examiner

*Primary Examiner*—Minh N Tang
(74) *Attorney, Agent, or Firm*—Clifford O. Chi

(57) ABSTRACT

A current detecting circuit includes a current detecting module includes a detecting resistor, a voltage transmitting module, and a current adjusting module including four field effect transistors, a transistor, and a operational amplifier. The first drain is connected to a power source via the detecting resistor. The first source is connected to a load. The second gate is connected to a signal control pin. The third gate is connected to the second drain. The fourth gate is connected to the third drain. The fourth source is connected to the power source via a first resistor and a collector. The first non-inverting input terminal is connected to the voltage transmitting module. An emitter is connected to the second non-inverting input terminal, and ground via a second resistor. The second non-inverting input terminal is connected to a cathode and the first standby power source.

4 Claims, 1 Drawing Sheet

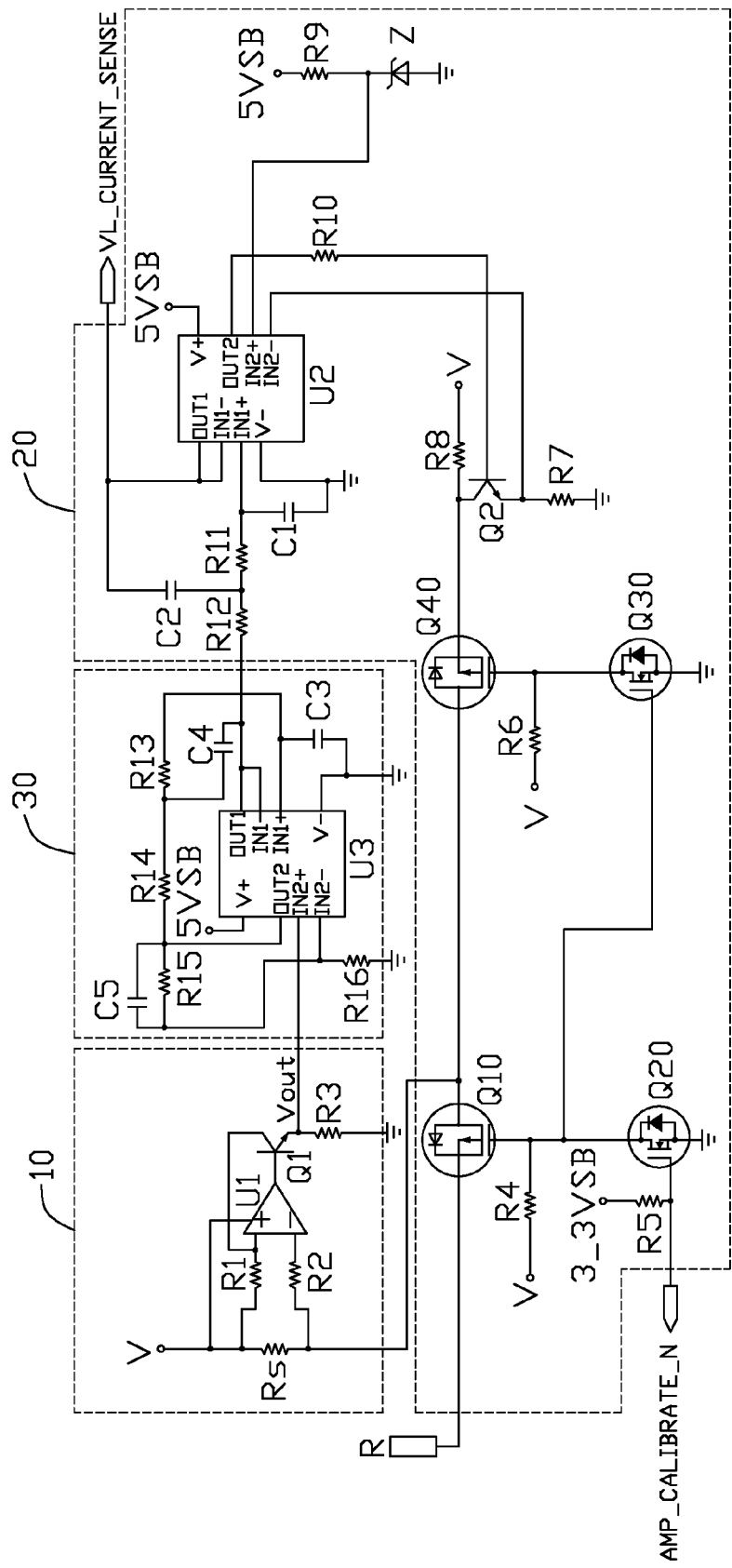

CURRENT DETECTING CIRCUIT

BACKGROUND

1. Field of the Invention

The present invention relates to detecting circuits and, more particularly, to a current detecting circuit.

2. Description of Related Art

To ensure quality design for circuit of electronic devices, testing the stability of current of a load is needed in the designing process. A typical current detecting circuit for testing current of the load is performed with a special chip which is very expensive.

What is needed, therefore, is a current detecting circuit which can solve the above problem.

BRIEF DESCRIPTION OF THE DRAWING

The drawing is a circuit diagram of an embodiment of a current detecting circuit.

DETAILED DESCRIPTION OF THE EMBODIMENTS

Referring to the drawing, an embodiment of a current detecting circuit in is used to test a current flowing through a load R. The current detecting circuit includes a current detecting module 10, a current adjusting module 20, and a voltage transmitting module 30.

The current detecting module 10 includes an operational amplifier U1, a transistor Q1, three resistors R1, R2, R3, and a detecting resistor Rs. The transistor Q1 having a base, a collector, and an emitter. A voltage terminal of the operational amplifier U1 is connected to a power source V. A non-inverting input terminal + of the operational amplifier U1 is connected to the power source V via the resistor R1, and connected to the collector of the transistor Q1. The power source V is connected to the current adjusting module 20 via the detecting resistor Rs, and connected to an inverting input terminal − of the operational amplifier U1 via the detecting resistor Rs and the resistor R2 in series. An output terminal of the operational amplifier U1 is connected to the base of the transistor Q1. The emitter of the transistor Q1 is grounded via the resistor R3 and connected to the voltage transmitting module 30.

The current adjusting module 20 includes four field effect transistors (FETs) Q10, Q20, Q30, Q40, eight resistors R4 through R12, two capacitors C1, C2, a transistor Q2, a voltage regulator diode Z, and an operational amplifier U2. The transistor Q2 having a base, a collector, and an emitter.

The current detecting module 10 is connected to the drain of the FET Q10. The source of the FET Q10 is connected to the load R. The power source V is connected to the gate of the FET Q10, the drain of the FET Q20, and the gate of the FET Q30 via the resistor R4. The gate of the FET Q20 is connected to a signal control pin AMP_CALIBRATE_N of a pulse generator chip, such as an input/output chip, and connected to a standby power source 3_3VSB via the resistor R5. Sources of the FETs Q20 and Q30 are grounded. The power source V is connected to the drain of the FET Q30 and the gate of the FET Q40 via the resistor R6. The drain of the FET Q40 is connected to the drain of the FET Q10. The source of the FET Q40 is connected to the power source V via the resistor R8 and the collector of the transistor Q2. The emitter of the transistor Q2 is grounded via the resistor R7 and connected to a second non-inverting input terminal IN2+ of the operational amplifier U2. The base of the transistor Q2 is connected to a second output terminal OUT2 of the operational amplifier U2 via the resistor R10. The second non-inverting input terminal IN2+ of the operational amplifier U2 is connected to a standby power source 5VSB via the resistor R9 and the cathode of the voltage regulator diode Z. The anode of the voltage regulator diode Z is grounded.

A voltage terminal V+ of the operational amplifier U2 is connected to the standby power source 5VSB. A first non-inverting input terminal IN1+ of the operational amplifier U2 is grounded via the capacitor C1 and connected to the voltage transmitting module 30 via the resistors R11 and R12 in series. An input pin VL_CURRENT_SENSE of a read chip, such as a base management controller (BMC), is connected to a first inverting input terminal IN1− and a first output pin OUT1 of the operational amplifier U2, and connected to a node between the resistor R11 and the resistor R12 via the capacitor C2.

The voltage transmitting module 30 includes four resistors R13, R14, R15, R16, three capacitors C3, C4, C5, and an operational amplifier U3. A first non-inverting input terminal IN1+ of the operational amplifier U3 is grounded via the capacitor C3 and grounded via the resistors R13, R14, R15, and R16 in series. A first inverting input terminal IN1− is connected to a first output terminal OUT1 of the operational amplifier U3. The first output terminal OUT1 of the operational amplifier U3 is connected to a node between the resistor R13 and the resistor R14 via the capacitor C4, and connected to the current adjusting module 20. A second output terminal OUT2 of the operational amplifier U3 is connected to a node between the resistors R14 and R15. A second inverting input terminal IN2− of the operational amplifier U3 is connected to the node between the resistors R15 and R16. A second non-inverting input terminal IN2+ of the operational amplifier U3 is connected to the current detecting module 10. A voltage terminal V+ of the operational amplifier U3 is connected to the standby power source VSB.

The capacitor C5 and the resistor R15 are connected in parallel. The voltage transmitting module 30 is used for transmitting an output voltage Vout from the current detecting module 10 to the read chip. The detail working principle of the voltage transmitting module 30 is not described in this embodiment.

In one embodiment, a resistance of the detecting resistor Rs is $R0$, and the current on the resistor Rs is $Is$. A voltage drop $Vs$ of the detecting resistor Rs is according to the formula: $Vs=Is*R0$. In this embodiment, a voltage drop of the resistor R1 is equal to the voltage drop of the detecting resistor Rs. A voltage at the non-inverting input terminal of the operational amplifier U1 is equal to a voltage at the inverting input terminal of the operational amplifier U1 according to a "false short" character of the operational amplifier U1. A current I of the transistor Q1 and the resistor R3 is according to the formula: $I=Vs/R1'$, where $R1'$ is the resistance of the resistor R1. Therefore, the output voltage Vout is according to the formula:

$$Vout=I*R3'=Vs*R3'/R1'=Is*R0*R3'/R1' \quad (1)$$

where $R0$, $R3'$, and $R1'$ denotes the resistances of the detecting resistor Rs, resistors R3 and R1. The values of the R0, R3', and R1' are invariable. Thus, the formula (2) can be derived from the formula (1):

$$Vout=Is*K \quad (2)$$

where K is a constant.

There is a linearity relation between the output voltage Vout and the current Is according to the formula (2). Therefore, there is a linearity relation between the actual output voltage Vout' of the current detecting module 10 and the current Is' of the detecting resistor Rs is according to the formula (3):

$$V\text{out}' = Is'*K' \quad (3)$$

where K' is a constant like the constant K.

The signal control pin AMP_CALIBRATE_N of the pulse generator chip outputs a low level signal. The FETs Q10 and Q20 are turned off. The FETs Q30 and Q40 are turned on. When the voltage Vx of the voltage regulator diode Z is set, the operational amplifier U2 and the transistor Q2 form a low dropout regulator. Therefore, the voltage of the second inverting input terminal IN2− of the operational amplifier U2 is equal to the voltage Vx. At the same time, the current passing through the transistor Q2 and the resistor R7 is equal to Vx/R7', wherein R7' is the resistance of the resistor R7. The voltage drop of the resistor R8 is equal to Vx*R8'/R7', wherein R8' is the resistance of the resistor R8. Since the resistor R8 and the detecting resistor Rs are connected in parallel, a voltage drop of the detecting resistor Rs is equal to a voltage drop of the resistor R8, according to the formula: Vs=Vx*R8'/R7'. A current of the detecting resistor Rs is according to the formula: Is'=Vx*R8'/(R7'*R0). The read chip reads the output voltage Vout' from the current detecting module 10. The K' can be derived from the formula (3): K'=Vout'/Is'. (4)

The signal control pin AMP_CALIBRATE_N of the pulse generator chip outputs a high level signal after the K' known. The FETs Q10 and Q20 are turned on. The FETs Q30 and Q40 are turned off. The load R will work. The read chip reads the output voltage Vout" from the detecting circuit 10. Therefore, the current Is"=Vout"/K'. Because the detecting resistor Rs and the load R are connected in series, a current of the detecting resistor Rs is equal to a current of the load R. Therefore, the current of the load R is Is".

For example, when the signal control pin AMP_CALIBRATE_N of the pulse generator chip outputs low level signal, the current Is' is 0 mA, and the read chip receives the voltage Vout'=2.5V, according to the formula (4), resulting in K'=0.25. When the signal control pin AMP_CALIBRATE_N of the pulse generator chip outputs a high level signal, the load R will work, the read chip reads the voltage Vout"=3V, and the K'=0.25. Therefore, the current Is"=3=12 A, and the current of the load R is 12 A.

The current detecting circuit can detect the current of the load R through the current detecting module 10 and the current adjusting module 20 and transform the current of the load R to an output voltage Vout, and send the output voltage Vout to the read chip through the voltage transmitting module 30. The read chip receives the output voltage Vout, and detects the current status of the load R according to the output voltage Vout.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A current detecting circuit for testing a current flowing through a load, comprising:

a current detecting module comprising a detecting resistor, the current detecting module configured to transform the current of the detecting resistor to an output voltage;

a voltage transmitting module configured to receive the output voltage from the current detecting module, and send the output voltage to a read chip, the read chip reading the output voltage; and a current adjusting module comprising:

a first field effect transistor (FET), wherein the drain of the first FET is connected to a power source via the detecting resistor; the source of the first FET is connected to the load;

a second FET, wherein the drain of the second FET is connected to the gate of the first FET; the gate of the second FET is connected to a signal control pin of a pulse generator chip;

a third FET, wherein the gate of the third FET is connected to the drain of the second FET;

a fourth FET, wherein the gate of the fourth FET is connected to the drain of the third FET; the drain of the fourth FET is connected to the drain of the first FET;

a first transistor comprising a base, a collector, and an emitter, wherein the source of the fourth FET is connected to the power source via a first resistor, and connected to the collector of the first transistor;

a first operational amplifier, wherein a first non-inverting input terminal of the first operational amplifier is connected to the voltage transmitting module; an input pin of the read chip is connected to a first inverting input terminal of the first operational amplifier and a first output terminal of the first operational amplifier; the emitter of the first transistor is connected to a second inverting input terminal of the first operational amplifier, and ground via a second resistor; the base of the first transistor is connected to a second output terminal of the first operational amplifier; a voltage terminal of the first operational amplifier is connected to a first standby power source; and a voltage regulator diode, wherein the second non-inverting input terminal of the first operational amplifier is connected to the cathode of the voltage regulator diode and a first standby power source; the anode of the voltage regulator diode is grounded.

2. The current detecting circuit of claim 1, wherein the current adjusting module further comprises:

a third resistor connected between the power source and the gate of the first FET;

a fourth resistor connected between a second standby power and the gate of the second FET;

a fifth resistor connected between the power source and the gate of the fourth FET;

a sixth resistor connected between a base of the first transistor and the second output terminal of the first operational amplifier;

a seventh resistor connected between the first standby power source and the cathode of the voltage regulator diode;

an eighth resistor and the ninth resistor connected in series between the first non-inverting input terminal of the first operational amplifier and the voltage transmitting module;

a first capacitor connected between the first non-inverting input terminal of the first operational amplifier and ground; and a second capacitor, wherein the first output terminal of the first operational amplifier is connected to a node between the eighth resistor and the ninth resistor via the second capacitor.

3. The current detecting circuit of claim 1, wherein the current detecting module comprises:

a second operational amplifier, wherein a voltage terminal of the second operational amplifier is connected to the power source, the power source is connected to the current adjusting module via the detecting resistor and connected to an inverting input terminal of the second operational amplifier via the eleventh resistor; and a second transistor, wherein a non-inverting input terminal of the second operational amplifier is connected to a collector of the second transistor and the power source via a tenth resistor, an output terminal of the second operational amplifier is connected to a base of the second transistor, an emitter of the second transistor is grounded via the twelfth resistor, the voltage transmitting module is connected to the emitter of the second transistor.

4. The current detecting circuit of claim 1, wherein the voltage transmitting module comprises a third operational amplifier; a first non-inverting input terminal of the third operational amplifier is grounded via a third capacitor and grounded via a thirteenth resistor, a fourteenth resistor, and a fifteenth resistor in series; a first inverting input terminal of the third operational amplifier is connected to a first output terminal of the third operational amplifier; the first output terminal of the third operational amplifier is connected to a node between the thirteenth resistor and the fourteenth resistor via a fourth capacitor and connected to the current adjusting module; a second output terminal of the third operational amplifier is connected to a node between the fourteenth resistor and the fifteenth resistor; a second inverting input terminal of the third operational amplifier is connected to a node between the fifteenth resistor and the sixteenth resistor; a second non-inverting input terminal of the operational amplifier is connected to the current detecting module; a voltage terminal of the third operational amplifier is connected to the first standby power source; a fifth capacitor and the fifteenth resistor are connected in parallel.

* * * * *